United States Patent
Tsuda (10) Patent No.: US 6,344,694 B1
(45) Date of Patent: Feb. 5, 2002

(54) SEMICONDUCTOR DEVICE AND METHOD FOR MANUFACTURING SAME

(75) Inventor: Hiroshi Tsuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/459,603

(22) Filed: Dec. 13, 1999

(30) Foreign Application Priority Data

Nov. 12, 1998 (JP) ............................................. 10-375146

(51) Int. Cl.[7] .......................... H01L 23/48; H01L 23/52
(52) U.S. Cl. ....................... 257/768; 257/763; 257/764; 257/770
(58) Field of Search ................................. 257/768, 763, 257/764, 770; 438/648, 650, 683, 685, 649

(56) References Cited

FOREIGN PATENT DOCUMENTS

| JP | 61-181150 | 8/1986 | |
| JP | 2-292866 | 12/1990 | |
| JP | 6-291141 | 10/1994 | |
| JP | 7-197246 | * 8/1995 | |
| JP | 7-245277 | 9/1995 | |
| JP | 9-50973 | 2/1997 | |
| JP | 9-219516 | * 8/1997 | |

* cited by examiner

*Primary Examiner*—Jhihan B Clark
(74) *Attorney, Agent, or Firm*—Sughrue, Mion, Zinn, Macpeak & Seas, PLLC

(57) ABSTRACT

A semiconductor device including: a semiconductor substrate, and an interconnect made of a titanium silicide film overlying the semiconductor substrate, the titanium silicide film including at least one atom selected from the group consisting of phosphorus, arsenic and antimony at an average density between $5 \times 10^{19}$ and $3 \times 10^{20}$ atoms/cm$^3$. Although the titanium silicide film is conventionally recognized to cause depletion of an underlying polysilicon and increase of a connected-polysilicon-plug resistance, these deficiencies can be suppressed by specifying the average density.

2 Claims, 6 Drawing Sheets

SEMICONDUCTOR DEVICE AND METHOD FOR MANUFACTURING SAME

BACKGROUND OF THE INVENTION (a) Field of the Invention

The present invention relates to a semiconductor device and a method for manufacturing the same, more in detail to the semiconductor device having an interconnect, including an electrode, made of a titanium silicide film or a titanium polycide film (a composite film including a polysilicon film and a titanium silicide film formed thereon), and the method for manufacturing the same.

(b) Description of the Related Art

With the progress of miniaturization of a semiconductor device in recent years, interconnects in the semiconductor device are required to have reduced resistances. The interconnects are also required to have a resistance to heat in order to be stabilized against a thermal treatment during manufacture. In recent years, a tungsten silicide film and a tungsten polycide film (a composite film including a polysilicon film and a tungsten silicide film formed thereon) have been employed as an interconnect material having the desired resistance to heat.

Figure 1A:
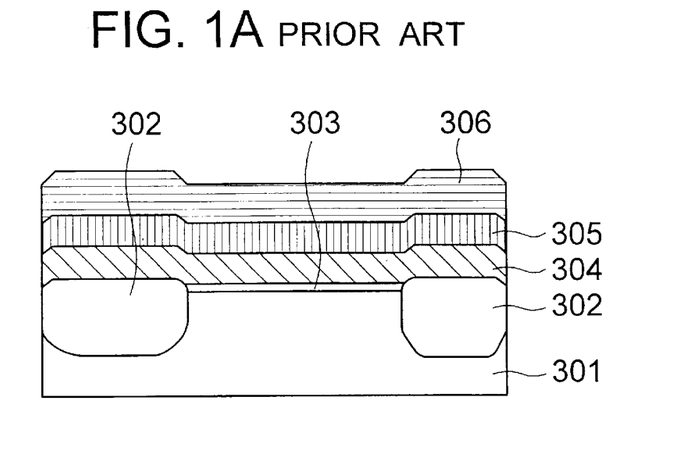
FIGS. 1A to 1C are vertical sectional views sequentially showing steps for manufacturing a conventional semiconductor device.
Figure 1B:
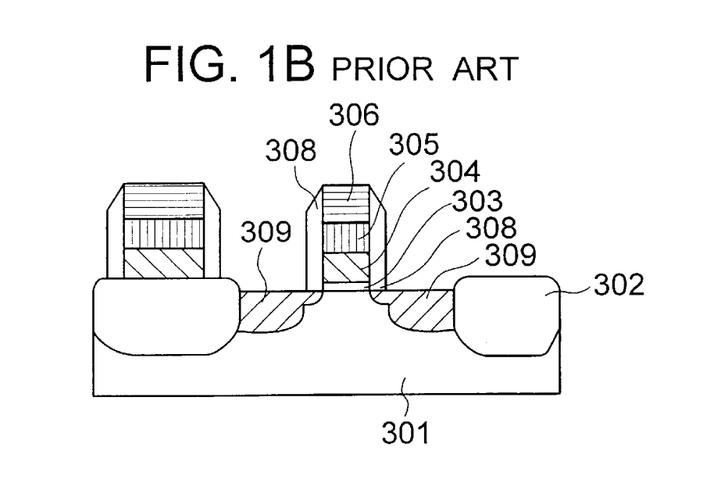
Figure 1C:
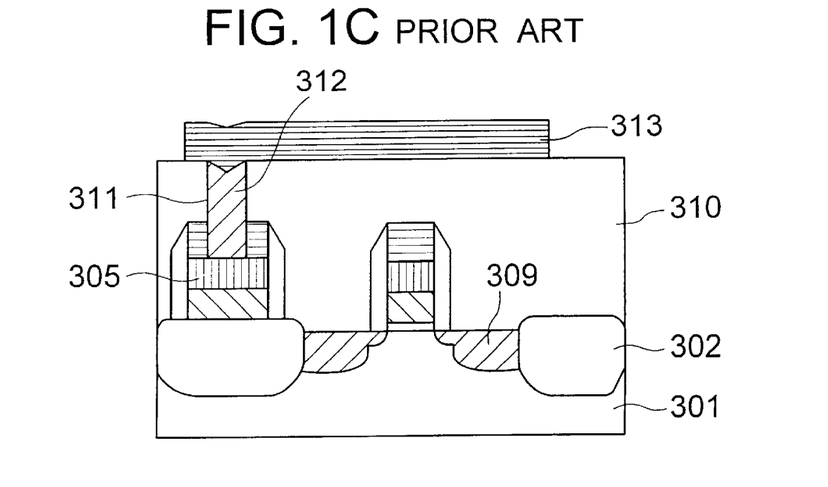

A conventional MOS transistor employing the tungsten silicide film as an interconnect material and a method for manufacturing the same will be briefly described referring to FIGS. 1A to 1C which are a series of vertical sectional views sequentially showing manufacture of a gate interconnect and an electrode connected thereto in a conventional semiconductor device.

After an oxide film 302 for separating elements is selectively formed on the surface of a silicon substrate 301 followed by formation of a gate dielectric film 303, a polysilicon film 304 for a gate interconnect of N-type conductivity having a thickness of 60 nm or more is formed. Phosphorous, for example, used as N-type impurities is doped into the polysilicon film 304 during the formation thereof by means of a chemical vapor-phase deposition (CVD) method. After an undoped polysilicon film is formed, a thermal treatment in an oxidative ambient including $POCl_3$ for thermal diffusion or ion injection of the phosphorous may be conducted for implementing the doping.

Then, a spontaneous oxidation film, if any, on the polysilicon film 304 is removed with a solution containing hydrofluoric acid. A tungsten silicide film 305 having a thickness of 100 nm or more is deposited on the polysilicon film 304 for forming a polycide structure. The tungsten silicide film 305 may be formed by employing the CVD method or a physical vapor-phase deposition (PVD) method such as sputtering.

Phosphorous is then injected into the tungsten silicide film 305.

Thereafter, a silicon nitride film 306 having a thickness of 100 nm or more is formed on the tungsten silicide film 305 (FIG. 1A).

By using ordinary resist application, exposure and development steps, a resist film (not shown) is patterned to have a gate electrode shape by anisotropic dry etching.

After the removal of the resist film, impurity ions are injected into the exposed silicon substrate 301 for forming an LLD (Lightly Doped Drain) region or an extension region, if necessary.

Then, a dielectric film (not shown) which properly covers steps in the wafer is formed by means of the CVD method. Side walls 308 made of dielectric films are formed by anisotropic etching-back. By employing, as a mask, the side walls 308 and the gate electrode formed by the films 304 to 306 on the silicon substrate 301, impurity ions are injected into the silicon substrate 301. A successive thermal treatment at an activation temperature between 800 and 900° C. forms a diffused layer 309 (FIG. 1B).

After an interlayer dielectric film 310 is formed, a via hole 311 reaching to the tungsten silicide film 305 is formed in the interlayer dielectric film 310.

Then, a polysilicon film 312 which properly covers steps in the wafer is deposited by means of the CVD method. The polysilicon 312 on the interlayer dielectric film 310 is removed by etching-back leaving the polysilicon 312 in the via hole 311. Phosphorous is injected into the polysilicon 312 remaining in the via hole 311.

After a tungsten silicide film 313 is deposited on the interlayer dielectric film 310, the tungsten silicide film 313 is patterned to a desired interconnect shape by means of anisotropic dry etching by using resist application, exposure and development steps (FIG. 1C).

Thereafter, the injected impurities are activated for forming, for example, a DRAM (Dynamic Random Access Memory). The activation also serves as a capacitance film forming step and a reflow and sintering step for the interlayer dielectric film.

The technique for injecting the phosphorous into the tungsten silicide film 305 in the above manufacturing steps is described, for example, in JP-A-2(1990)-292866. The phosphorous injection conducted for providing the excessive phosphorous in the tungsten silicide film 305 before the thermal treatment suppresses depletion of the polysilicon and increase of the plug resistance.

In the gate electrode including the tungsten silicide 305 on the polysilicon 304 doped with the N-type impurities such as phosphorous, the phosphorous may diffuse from the polysilicon 304 into the silicide 305 to deplete the polysilicon 304 on the gate dielectric film 303.

When an electric connection is formed on the tungsten silicide 305 by employing the polysilicon plug 312 doped with the phosphorous, the phosphorous may also diffuse from the polysilicon 312 into the tungsten silicide to increase the entire resistance of the plug.

The excessive phosphorous injection into the tungsten silicide film 305 in advance prevents the phosphorous diffusion from the adjacent polysilicons 304 and 312 during the thermal treatment. The prevention of the decrease of the phosphorous in the polysilicons 304 and 312 suppresses the depletion and the increase of the plug resistance.

However, in order to realize a DRAM having integration larger than 1 G-bit, an interconnect width should be narrowed while maintaining the sensibility of a sense amplifier. Employment of the tungsten silicide film as an interconnect material requires the film thickness entirely thicker than the gate interconnect width for maintaining the low resistance. In other words, a large aspect ratio is needed to cause a problem that formation of the gate structure including the tungsten silicide film is difficult.

In order to realize the DRAM having 1 G-bit or more, for example, a sheet resistance is desirably maintained at 5 Ω/☐ or less. However, the realization of the sheet resistance of 5 Ω/☐ or less by employing the tungsten silicide film having a resistivity of about 100 $\mu\Omega$ cm requires the tungsten silicide film having a thickness of 200 nm.

The thickness of an interconnect made of the tungsten silicide film immediately after the addition to the gate electrode amounts to 360 nm or more including the underlying polysilicon layer of 60 nm or more and the overlying nitride layer of 100 nm or more. The above thickness is twice or more the gate interconnect width of 180 nm of the DRAM having around 1 G-bit.

The larger aspect ratio makes it difficult to form a via hole in a diffused layer between gate electrodes and to embed a contact electrode in a DRAM cell.

A titanium silicide film having low resistivity between 20 and 25 $\mu \Omega$ cm may be employed for thinning the interconnect in place of the tungsten silicide film having the higher resistance.

The employment of the titanium silicide film causes another problem that a larger precipitate is generated in the film. The larger precipitate is a crystal of which main components are titanium (Ti) and phosphorous (P), and may grow to a size which can be observed through the overlying dielectric film with an optical microscope.

Figure 2:
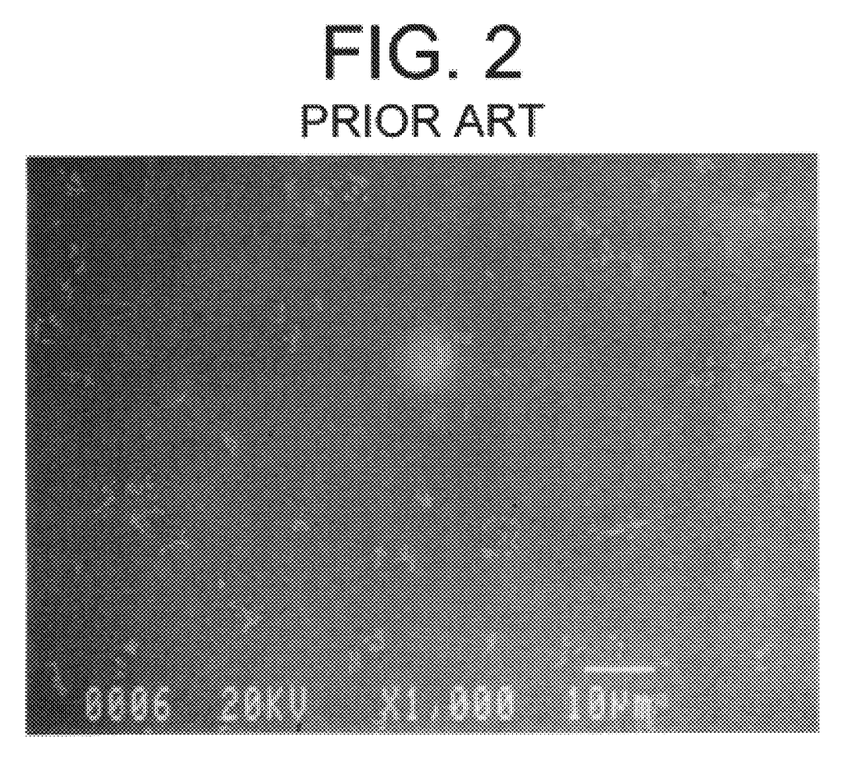
FIG. 2 is a microphotograph of an SEM image showing a titanium silicide film injected with phosphorous at a density of $5 \times 10^{20}$ atoms/cm$^3$ having larger precipitates thereon.

FIG. 2 is a microphotograph showing an image of the larger precipitate taken with a scanning electron microscope (SEM). The SEM image is obtained by observing the larger precipitate remaining on the polysilicon with the SEM after removal of the overlying dielectric film and the titanium silicide by wet-etching. Several white portions scattered and shrank in the SEM image are the larger precipitates.

Once the precipitates are formed, the diffusion from the polysilicon film into the titanium silicide film further proceeds resulting in the depletion of the polysilicon gate and the increase of the polysilicon plug.

The larger precipitate is not generated in the tungsten silicide film because a tungsten atom hardly diffuses compared with a titanium atom and the tungsten atoms are not likely to agglomerate in the silicide film. This may be induced by the fact that the melting point of the tungsten silicide is 2150° C. which is higher than the melting point of the titanium silicide of 1540° C.

SUMMARY OF THE INVENTION

In view of the foregoing, an object of the present is to provide a semiconductor device and a method for manufacturing the same in which formation of larger precipitates, depletion of a gate and increase of a plug resistance can be suppressed.

The present invention provides, in a first aspect thereof, a semiconductor device including: a semiconductor substrate; a plurality of electric elements formed on said semiconductor substrate, and an interconnect layer including a plurality of interconnects made of a titanium silicide film and connecting said electric elements together, the titanium silicide film including at least one atom selected from the group consisting of phosphorus, arsenic and antimony at an average density between $5 \times 10^{19}$ and $3 \times 10^{20}$ atoms/cm$^3$.

The present invention further provides, in a second aspect thereof, a method for manufacturing a method for manufacturing a semiconductor device including the steps of: forming a titanium silicide film overlying a semiconductor substrate having electric elements thereon; and injecting at least one atom selected from a group consisting of phosphorous, arsenic and antimony into the titanium silicide film so that an average density of the injected atom becomes in a range between $5 \times 10^{19}$ and $3 \times 10^{20}$ atoms/cm$^3$.

In accordance with the present invention, in the semiconductor device including an interconnect and an electrode having titanium silicide films of which resistivity is lower than that of a tungsten silicide film, formation of larger precipitates in the titanium silicide film, depletion of a polysilicon plug connected to the titanium silicide film and increase of a plug resistance can be suppressed based on a fundamental concept that the titanium silicide film has at least atom selected from a group consisting of phosphorus, arsenic and antimony at an average density between $5 \times 10^{19}$ and $3 \times 10^{20}$ atoms/cm$^3$.

The above and other objects, features and advantages of the present invention will be more apparent from the following description.

PREFERRED EMBODIMENTS OF THE INVENTION

A reason for specifying the lower limit of the above average density is as follows.

When at least one of phosphorous, arsenic and antimony which is contained in the polysilicon film adjacent to the titanium silicide film as N-type impurities is also contained in the titanium silicide film, the density gradient is not increased even after a thermal treatment and the diffusion of the atom from the polysilicon film into the titanium silicide film is suppressed. Accordingly, the depletion of the polysilicon gate and the increase of a polysilicon plug in contact with the titanium silicide film can be also suppressed.

A reason for specifying the upper limit of the above average density is as follows.

When the density of the phosphorous, the arsenic and the antimony contained in the titanium silicide film is over the upper limit after the thermal treatment for activating a diffused layer, forming a capacitive layer and sintering/reflowing an interlayer dielectric film at 800° C. or more for 30 minutes 10 seconds during a post-DRAM manufacturing step, larger precipitates of a titanium-phosphorous compound, a titanium-arsenic compound and a titanium antimony compound are formed by combination of the titanium with the phosphorous, with the arsenic, and with antimony, respectively.

Now, the present invention is more specifically described with reference to accompanying drawings.

Embodiment 1

Figure 3A:
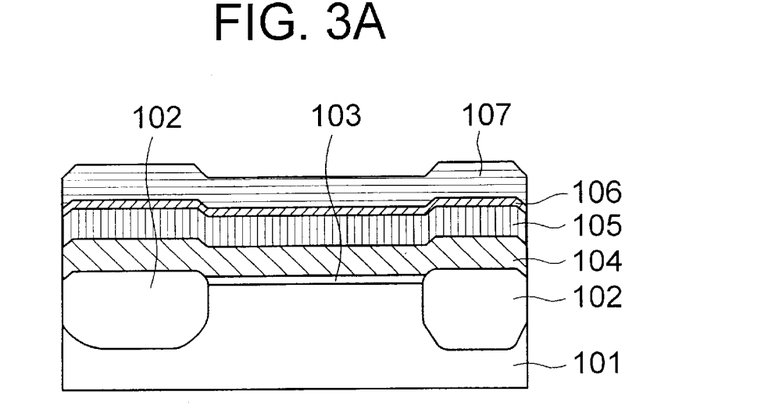
FIGS. 3A to 3C are vertical sectional views sequentially showing steps for manufacturing a semiconductor device in accordance with embodiment 1 of the present invention.
Figure 3B:
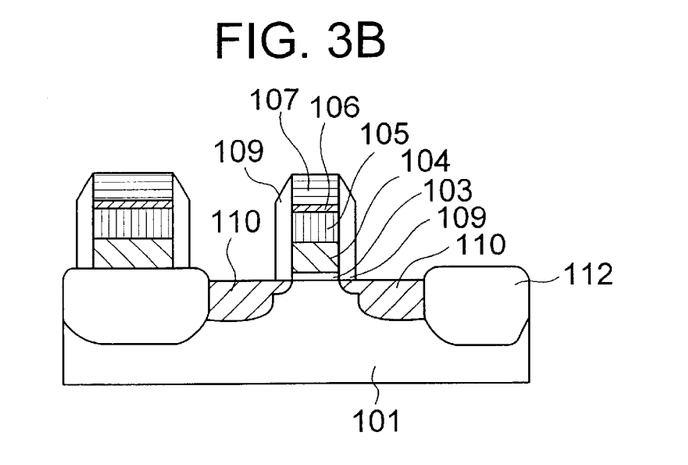
Figure 3C:
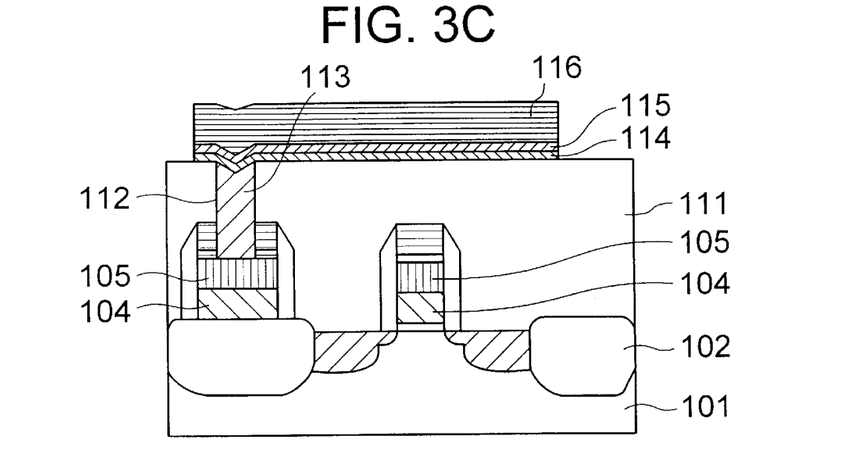

In FIGS. 3A to 3C, several steps for manufacturing a gate interconnect and an electrode connected thereto among the main steps for manufacturing a MOS transistor are sequentially shown.

After an oxide film 102 for separating elements was selectively formed on the surface of a silicon substrate 101 followed by formation of a gate dielectric film 103, a polysilicon film 104 for a gate interconnect of N-type conductivity was formed. Phosphorous which may be used as N-type impurities was injected into the polysilicon film 104 during the formation thereof by means of a CVD method. After an undoped polysilicon film was formed, a thermal treatment in an oxidative ambient including $POCl_3$ for thermal diffusion or ion injection of the phosphorous was conducted for implementing the doping. The density of the phosphorous in the polysilicon film 104 was determined such that the depletion of the gate did not occur even if the gate electrode made of only the polysilicon was used.

After a spontaneous oxidation film, if any, on the polysilicon film 104 was removed, a titanium silicide film 105 having a thickness of 100 nm was deposited for forming a polycide structure. The titanium silicide film 105 was formed by employing the CVD method or a PVD method such as sputtering.

The titanium silicide film 105 could be deposited by means of the sputtering by employing an alloy target containing, for example, silicon and titanium in a molar ratio of 2.4 at a substrate temperature of 200° C. The employment of such an alloy target made the composition of the deposited titanium silicide film nearly equal to the composition of the target to provide the titanium silicide film 105 containing the silicon and the titanium in the molar ratio of 2.4.

Immediately after the deposition of the titanium silicide film 105, the wafer was subjected to a rapid thermal treatment at 850° C. for 10 seconds to crystallize the titanium silicide film into a low resistance C54-phase. The crystallization reduced disturbance of the crystals before the patterning and increased a durability against the agglomeration of the thin interconnect after the patterning.

Then, the phosphorous was ion-injected, for example, at a dosage of $3 \times 10^{15}$ atoms/$cm^2$ and an injection energy of 30 keV. Thereafter, a silicon oxide film 106 and a silicon nitride film 107 were sequentially formed (FIG. 3A).

The silicon nitride film 107, the silicon oxide film 106, the titanium silicide film 105 and the polysilicon film 104 were sequentially etched and patterned to have a gate electrode shape by anisotropic dry etching by using ordinary resist application, exposure and development steps.

If necessary, the silicon nitride film 107 may be patterned after formation of a reflection-prevention film thereon. After the removal of residues of the etching, impurity ions was injected into the exposed silicon substrate 101 for forming an LLD region or an extension region, if necessary.

After a dielectric film (not shown) which properly covered the steps in the wafer was formed by means of the CVD method, side walls 109 made of the above dielectric film were formed by anisotropic etching-back. By employing, as a mask, the side walls 109 and the gate electrode formed by the films 104 to 107 on the silicon substrate 101, impurity ions were injected into the silicon substrate 101. A successive thermal treatment at an activation temperature between 800 and 900° C. formed a diffused layer 110 (FIG. 3B).

After formation of an interlayer dielectric film 111 and a via hole 112 reaching to the silicide film 105, a polysilicon film 113 which properly covered the steps in the wafer was deposited by means of the CVD method. After the polysilicon 113 on the interlayer dielectric film 111 was removed by etching-back for leaving the polysilicon 113 in the via hole 112, phosphorous was injected into the polysilicon 113 remaining in the via hole 112.

Then, a thermal treatment was conducted at 900° C. for 1 minute for activating the phosphorous in the via hole 112. After a titanium (Ti) film 114, a titanium nitride (TiN) film 115 and an aluminum (Al) film 116 were sequentially deposited on the interlayer dielectric film 111, the respective films were patterned to a desired interconnect shape by means of anisotropic dry etching by using resist application, exposure and development steps. Finally, the wafer was annealed in a hydrogen ambient (FIG. 3C).

Figure 4:
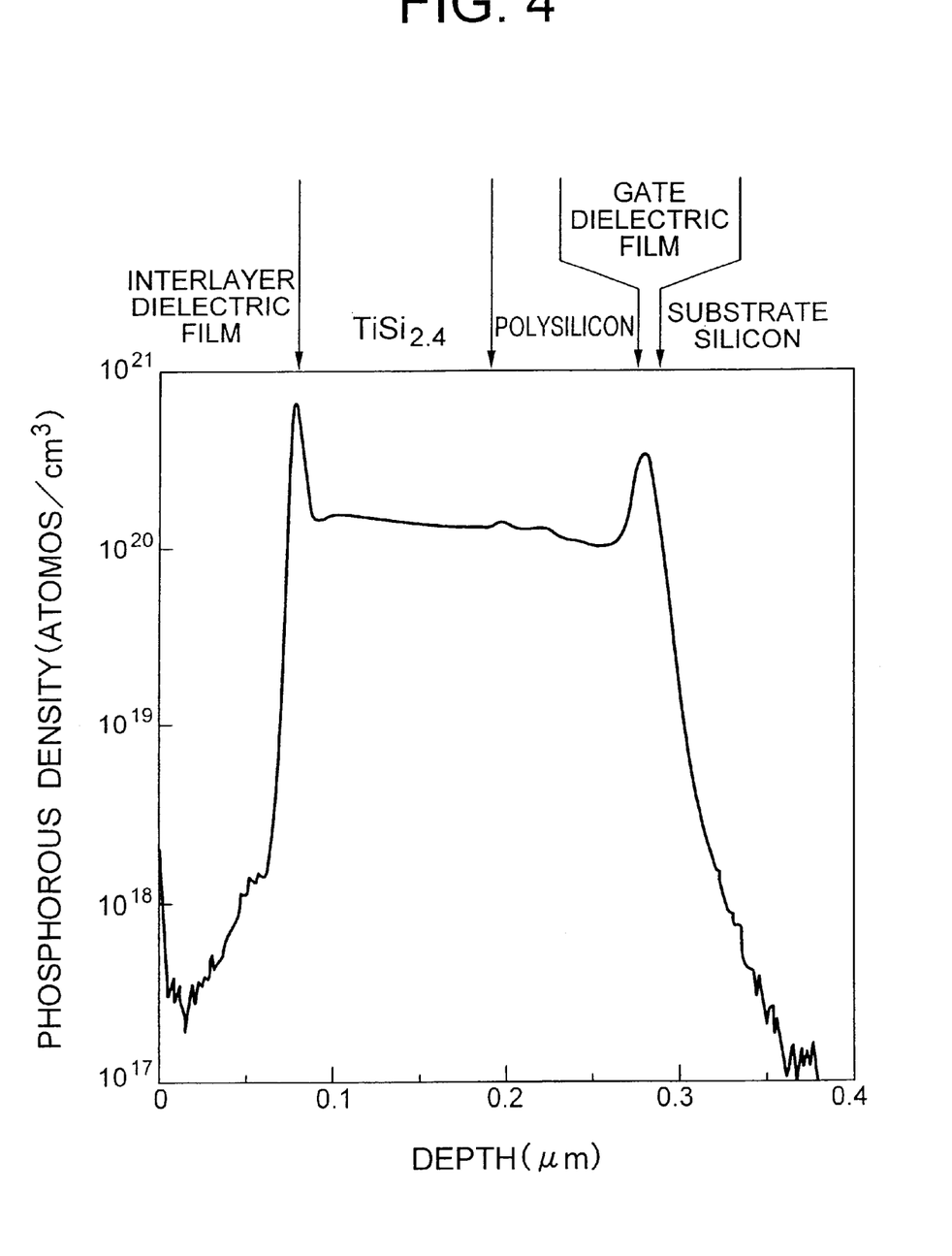
FIG. 4 is a graph showing the density distribution of the phosphorus in a direction of depth in the titanium silicide film.
Figure 5:
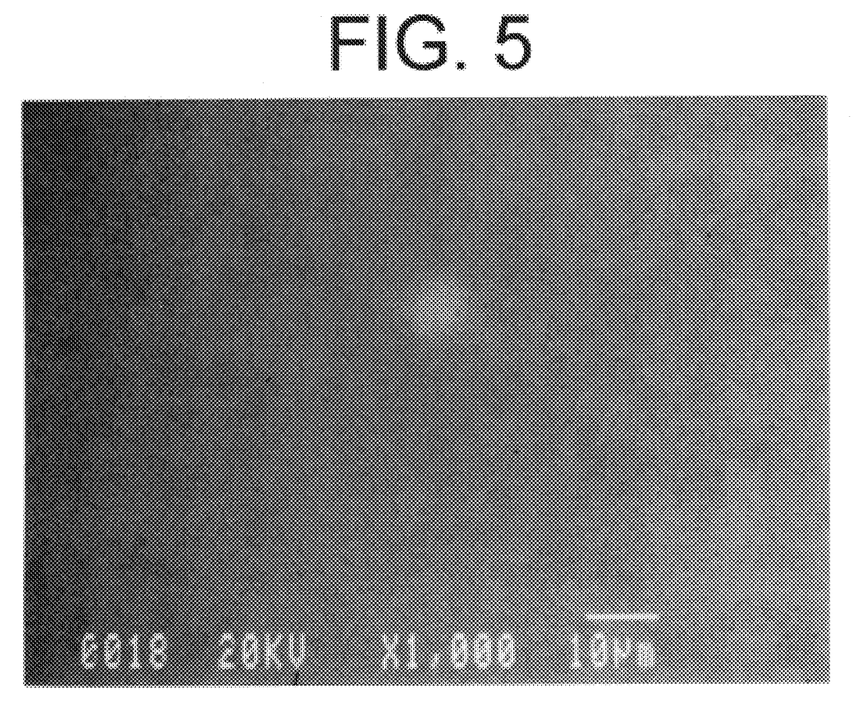
FIG. 5 is a microphotograph of an SEM image showing a titanium silicide film injected with phosphorous at a density of $3 \times 10^{20}$ atoms/cm$^3$ having no larger precipitates thereon.

A graph of FIG. 4 obtained by means of secondary ion mass spectrometric analysis shows the density distribution of the phosphorus in the titanium silicide film in a direction of depth prepared in this manner. Since the phosphorus density in the titanium silicide film was $3 \times 10^{20}$ atoms/$cm^3$ or less as shown in the graph, substantially no larger precipitate shown in the microphotograph of FIG. 2 was generated.

As a result of measurement of a dependency of a gate capacitance between the gate interconnect and the substrate on an applied voltage, substantially no occurrence of the depletion was confirmed. As a result of the measurement, the resistance of the plug including the overlying polysilicon film was not increased. The resulting sheet resistance of the interconnect of 3 Ω/□ or less could be realized which was lower than 6 Ω/□ obtained in the conventional wafer employing the tungsten silicide film having a thickness of 150 nm. Accordingly, the interconnect is applicable to a MOS transistor having a low resistance gate interconnect and a gate width of 0.18 μm.

The above effect could be also obtained in case that the injection dosage ranged between $5 \times 10^{14}$ and $3 \times 10^{15}$ atoms/$cm^2$ when the thickness of the titanium silicide film was 100 nm.

When, on the other hand, the average phosphorous density in the titanium silicide film before the thermal treatment was, for example, $5 \times 10^{20}$ atoms/$cm^3$, larger precipitates shown in FIG. 2 were generated because the phosphorous in the titanium silicide film was supersaturated. A tendency of the precipitation was that the density of the larger precipitates was increased with elevation of the thermal treatment temperature in the range of over 800° C. because a reaction of forming precipitation nuclei was accelerated, and the size of the larger precipitate was increased with lengthening of a period of the thermal treatment time because the diffusion was promoted.

However, depending on the selection and the combination of the thermal treatment conditions, the above tendency was not always observed.

The occurrence of the precipitation was mainly dependent on the phosphorous density in the titanium silicide film, and was scarcely dependent on the thickness of the titanium silicide film and the film-forming temperature.

Although the titanium silicide film having the thickness of 100 nm has been described, similar effects could be obtained in the titanium silicide film having the thickness between 70 and 130 nm by adjusting the dosage. Although the titanium silicide film having the silicon and the titanium in the molar ratio of 2.4 has been described, similar effects could be obtained in the titanium silicide film having the molar ratio between 2.1 and 2.7.

A reaction of forming initial precipitation nuclei was accelerated with decrease of the silicon content and increase of the titanium content so that the precipitation density of the larger precipitate was increased and the average size of the larger precipitate was likely to be decreased.

Although the titanium silicide film deposited at the substrate temperature of 200° C. has been described, similar effects could be obtained as well when an amorphous titanium silicide film deposited at the substrate temperature between room temperature and 350° C. was employed and also when a C49-crystal phase titanium silicide film deposited in a temperature range between 350 and 500° C. was employed.

Although the phosphorous has been described as a representative of the N-type impurities in the polysilicon and a diffusion coefficient of arsenic or antimony was different from that of the phosphorous, similar effects could be obtained when arsenic or antimony was employed in a similar density range.

Embodiment 2

Figure 6A:
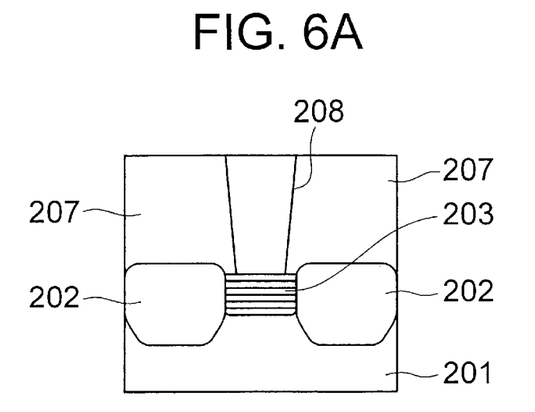
FIGS. 6A to 6C are vertical sectional views sequentially showing steps for manufacturing a semiconductor device in accordance with Embodiment 2.
Figure 6B:
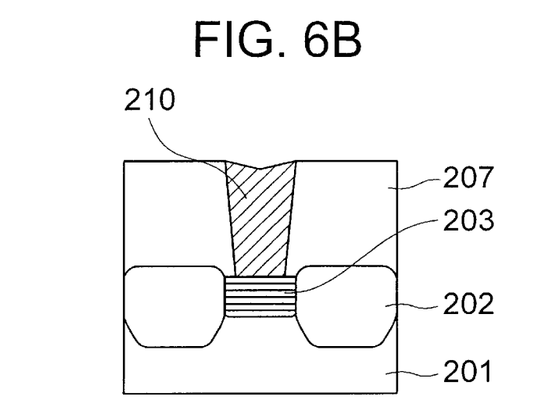
Figure 6C:
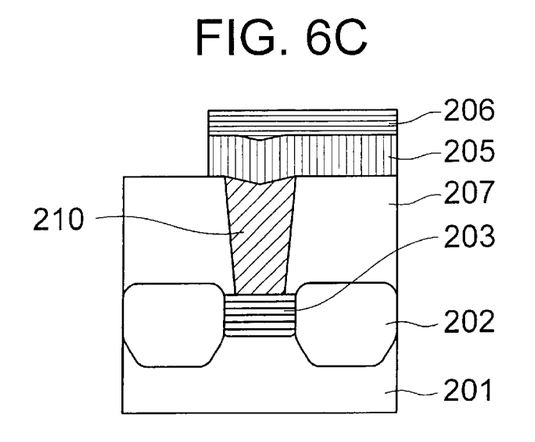

In FIGS. 6A to 6C, several steps for manufacturing a via plug connected to a diffused layer and an interconnect for signals connected to the via plug among the main steps for manufacturing a DRAM are sequentially shown, and steps for making an ordinary undercoat of the DRAM are omitted.

After an oxide film 202 for separating elements was selectively formed on the surface of a silicon substrate 201 followed by sequential formation of a gate interconnect and an impurity diffused layer 203, an interlayer dielectric film 207 was formed. A via hole 208 penetrating the interlayer dielectric film 207 was formed in accordance with ordinary resist application, exposure, development and dry etching steps (FIG. 6A).

After the bottom and the side of the exposed via hole 208 were cleansed, polysilicon 210 which covered the entire surface of the interlayer dielectric film 207 and the inner surface of the via hole was deposited by employing the CVD method. Then, the polysilicon other than in the via hole 208 was removed by etching-back.

Then, phosphorous was doped into the polysilicon by ion injection. Phosphorous doping could be also conducted by employing a gas such as phosphine ($PH_3$) by means of the CVD method during CVD-polysilicon 210 deposition. Even if the silicon was amorphous at the time of the film formation, the amorphous silicon could be converted into the polysilicon by means of crystallization at the time of the subsequent thermal treatment. The injected phosphorous in the polysilicon was activated by the thermal treatment at 900° C. for 1 minute (FIG. 6B).

After a native oxide film on the surface of the polysilicon 210 embedded in the via hole was removed by employing a solution containing hydrofluoric acid, a titanium silicide film 205 having a thickness of 100 nm was deposited by a CVD method or a PVD method. The titanium silicide film 205 was deposited by employing an alloy target containing, for example, silicon and titanium in a molar ratio of 2.4 at a substrate temperature of 200° C. by means of sputtering.

The employment of such an alloy target made the composition of the deposited titanium silicide film nearly equal to the composition of the target to provide the titanium silicide film 205 containing the silicon and the titanium in the molar ratio of 2.4.

Immediately after the deposition of the titanium silicide film 205, the wafer was subjected to a rapid thermal treatment at 850° C. for 10 seconds to crystallize the titanium silicide film into a low resistance C54-phase. The crystallization reduced disturbance of the crystals before the patterning and increased a durability against the agglomeration of the thin interconnect after the patterning.

Then, phosphorous was injected, for example, at a dosage of $3 \times 10^{15}$ atoms/cm$^2$ and an injection energy of 30 keV.

After a silicon oxide film 206 was deposited on the titanium silicide film 205, these two films 206 and 205 were sequentially etched to be patterned to an interconnect for signals having a desired shape by means of anisotropic dry etching by using resist application, exposure and development steps (FIG. 6C).

After an interlayer dielectric film (not shown) was deposited, a thermal treatment was conducted at 800° C. for 30 minutes which also served as a reflow and sintering step. The dry etching steps including the resist application, the exposure and the development steps were repeated to form a via hole, in the interlayer dielectric film, reaching to the titanium silicide film 205 to form a patterned electrode (not shown) for measuring a resistance.

In this manner, the titanium silicide film 205 having a sheet resistance of 3 Ω/□ or less was obtained. Substantially no larger precipitate observed with an optical microscope was generated.

A resistance per one unit was calculated by measuring a chain resistance of the diffused layer silicon—the polysilicon plug—the titanium silicide film. A resistance of 400 Ω was obtained when the inner diameter of the via plug was 0.4 µm and the depth was 0.8 µm. A similar result with respect to the plug resistance was obtained to that of the conventional wafer.

Even the interconnect employing the low resistance titanium silicide film could suppress the formation of the larger precipitate in the film to provide a semiconductor device which suppressed the increase of the plug resistance.

The phosphorous having an average density of $3 \times 10^{20}$ atoms/cm$^3$ in the titanium silicide has been described. In case of the titanium silicide film thickness of 100 nm and the dosage between $5 \times 10^{14}$ and $3 \times 10^{15}$ atoms/cm$^3$, the larger precipitate was not generated and the resistance of the plug including the underlying polysilicon was not increased.

When, on the other hand, the average phosphorous density in the titanium silicide film was, for example, $5 \times 10^{20}$ atoms/cm$^3$, larger precipitates shown in FIG. 2 were generated because the phosphorous in the titanium silicide film was supersaturated. A tendency of the precipitation was that the density of the larger precipitates was increased with elevation of the thermal treatment temperature in the range of over 800° C. because a reaction of forming precipitation nuclei was accelerated, and the size of the larger precipitate was increased with lengthening of a period of the thermal treatment time because the diffusion was promoted. However, depending on the selection and the combination of the thermal treatment conditions, the above tendency was not always observed.

The occurrence of the precipitation was mainly dependent on the phosphorous density in the titanium silicide film, and was scarcely dependent on the thickness of the titanium silicide film and the film-forming temperature.

Although the titanium silicide film having the thickness of 100 nm has been described, similar effects could be obtained in the titanium silicide film having the thickness between 70 and 130 nm by adjusting the dosage. Although the titanium silicide film having the silicon and the titanium in the molar ratio of 2.4 has been described, similar effects could be obtained in the titanium silicide film having the molar ratio between 2.1 and 2.7.

Since a reaction of forming initial precipitation nuclei was accelerated with decrease of the silicon content and increase of the titanium content, the precipitation density of the larger precipitate was increased and the average size of the larger precipitate was likely to be decreased.

Although the titanium silicide film deposited at the substrate temperature of 200° C. has been described, similar effects could be obtained as well when an amorphous titanium silicide film deposited at the substrate temperature between room temperature and 350° C. and also when a C49-crystal phase titanium silicide film thermally treated in a temperature range between 350 and 500° C. was employed.

Although the silicon diffused layer 203 was connected to the bottom of polysilicon plug 210 in Embodiment 2, the titanium silicide employed in Embodiment 1 or the conventional tungsten silicide may be employed in place of the silicon diffused layer 203.

Although the phosphorous has been described as a representative of the N-type impurities in the polysilicon and a diffusion coefficient of arsenic or antimony was different from that of the phosphorous, similar effects could be obtained when arsenic or antimony was employed in a similar density range.

Since the above embodiments are described only for examples, the present invention is not limited to the above embodiments and various modifications or alternations can be easily made therefrom by those skilled in the art without departing from the scope of the present invention.

What is claimed is:

1. A semiconductor device comprising:

a semiconductor substrate;

a plurality of electric elements formed on said semiconductor substrate, and an interconnect layer including a plurality of interconnects made of a titanium silicide film and connecting said electric elements together, the titanium silicide film including at least one atom selected from the group consisting of phosphorus, arsenic and antimony at an average density between $5 \times 10^{19}$ and $3 \times 10^{20}$ atoms/cm$^3$.

2. The semiconductor device as defined in claim 1, wherein the titanium silicide film has a molar ratio of silicon to titanium between 2.1 and 2.7.

* * * * *